(12) United States Patent
Chen et al.

(10) Patent No.: US 11,191,156 B2
(45) Date of Patent: Nov. 30, 2021

(54) LINK LOOPBACK DEVICE

(71) Applicant: Dongguan Luxshare Technologies Co., Ltd, Dungguan (CN)

(72) Inventors: QiongNan Chen, Dongguan (CN); ShuangFeng Yuan, Dongguan (CN); XuePing Shen, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/897,821

(22) Filed: Jun. 10, 2020

(65) Prior Publication Data

US 2020/0396831 A1 Dec. 17, 2020

(30) Foreign Application Priority Data

Jun. 11, 2019 (CN) .......................... 201910500627.6

(51) Int. Cl.
*H05K 1/00* (2006.01)
*H05K 1/02* (2006.01)
(Continued)

(52) U.S. Cl.
CPC ......... *H05K 1/0277* (2013.01); *H05K 1/0213* (2013.01); *H05K 7/1427* (2013.01); *H04L 43/0817* (2013.01); *H05K 2201/056* (2013.01)

(58) Field of Classification Search
CPC .. H05K 1/0277; H05K 1/0213; H05K 7/1427; H05K 2201/056; H04L 43/0817
See application file for complete search history.

(56) References Cited

U.S. PATENT DOCUMENTS

| 7,196,275 | B2 * | 3/2007 | Babb ..................... H01L 23/552 174/377 |
| 2006/0109394 | A1 * | 5/2006 | Miyagawa ............. H05K 3/361 349/58 |

(Continued)

FOREIGN PATENT DOCUMENTS

CN 201398197 Y 2/2010
TW 200636638 A 10/2006

OTHER PUBLICATIONS

The product description, Loopback Module, 100G QSFP28, BIZLINK, Feb. 2019, Total 2 pages. www.bizlinktech.com.

*Primary Examiner* — Pete T Lee
(74) *Attorney, Agent, or Firm* — Birch, Stewart, Kolasch & Birch, LLP

(57) ABSTRACT

The present disclosure disclosed a link loopback device comprising a substrate and a flexible circuit board. The substrate comprises an interface connecting end, a transmitting end, and a receiving end. The interface connecting end is electrically connected to the transmitting end and the receiving end. The flexible circuit board comprises a first electrical connecting end and a second electrical connecting end. The first electrical connecting end of the flexible circuit board is electrically connected to the transmitting end of the substrate, and the second electrical connecting end of the flexible circuit board is electrically connected to the receiving end of the substrate, forming a link between the flexible circuit board and the substrate. Just like testing with a direct attach cable (DAC), the link loopback device of the present disclosure can simulate a complete actual link to improve the accuracy of the test effectively.

4 Claims, 11 Drawing Sheets

(51) Int. Cl.
*H05K 7/14* (2006.01)
*H04L 12/26* (2006.01)

(56) References Cited

U.S. PATENT DOCUMENTS

| | | | |
|---|---|---|---|
| 2006/0230659 A1 | 10/2006 | Hu | |
| 2008/0066953 A1* | 3/2008 | Kanai | H05K 3/403 |
| | | | 174/260 |
| 2014/0078692 A1* | 3/2014 | Park | H05K 1/0278 |
| | | | 361/749 |
| 2020/0303850 A1* | 9/2020 | Roh | H01R 12/62 |

* cited by examiner

LINK LOOPBACK DEVICE

CROSS REFERENCE TO RELATED APPLICATION

This application claims the priority benefit of Chinese Patent Application Serial Number 201910500627.6, filed on Jun. 11, 2019, the full disclosure of which is incorporated herein by reference.

BACKGROUND

Technical Field

The present disclosure relates to the technical field of communication network device test, particularly a link loopback device.

Related Art

The special testing system built by direct attach cable (DAC) is used for the current loopback performance detection of high-speed communication network equipment such as 40G routers and switches. The tests by DAC may simulate complete actual links, but it occupies a lot of space and is not easy to set up. In order to solve the above problems, the link loopback device is currently introduced for the test. The attenuation test by the link loopback device on the communication network device is conducted by setting resistors. However, the attenuation value cannot start from 0 dB in the test, so the complete actual link cannot be simulated. Thus, the accuracy of the test is affected.

SUMMARY

A link loopback device of the embodiment of the present disclosure is provided to cope with the issue that the performance of the communication network devices could not be accurately determined due to the actual link is failed to be simulated dining the testing process of communication network devices.

The present disclosure provides a link loopback device comprising a substrate having an interface connecting end, a transmitting end, and a receiving end, wherein the interface connecting end is electrically connected to the transmitting end and the receiving end; a flexible circuit board having a first electrical connecting end and a second electrical connecting end, wherein the first electrical connecting end of the flexible circuit board is electrically connected to the transmitting end of the substrate, and the second electrical connecting end of the flexible circuit board is electrically connected to the receiving end of the substrate, forming a link between the flexible circuit board and the substrate.

In the embodiments of the present disclosure, the attenuation test of the communication network device is performed by applying the flexible circuit board, and the flexible circuit board with the corresponding length can be disposed according to the requirement of attenuation of the communication network device. Just like testing with a DAC, the link loopback device of the present disclosure can simulate a complete actual link to improve the accuracy of the test effectively.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
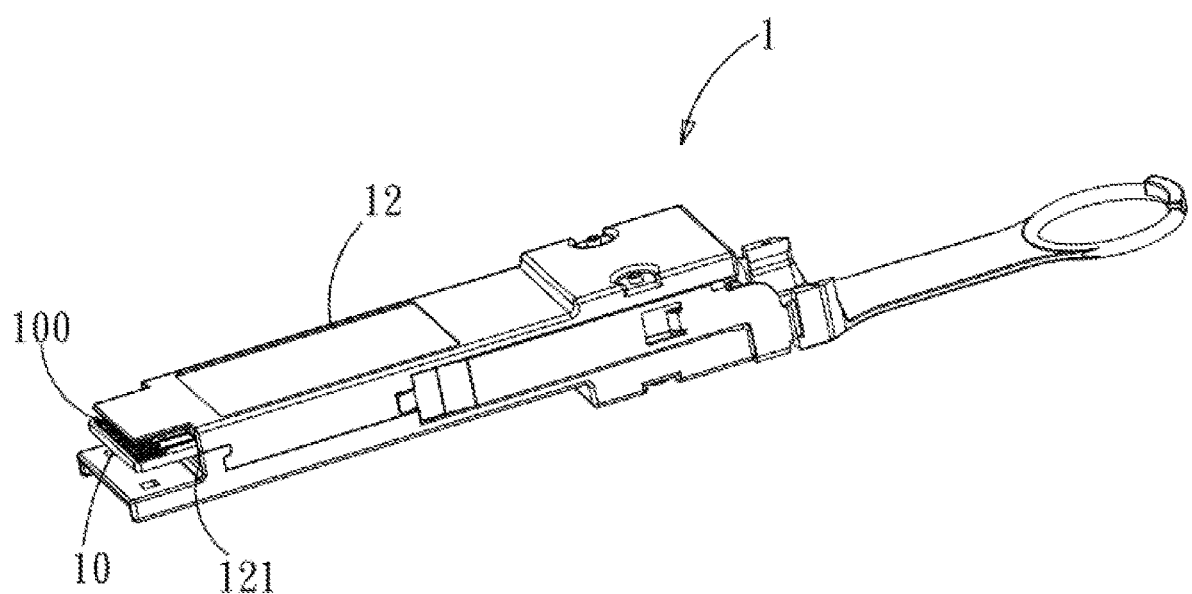
FIG. 1 is a perspective view of the link loopback device of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Figure 2:
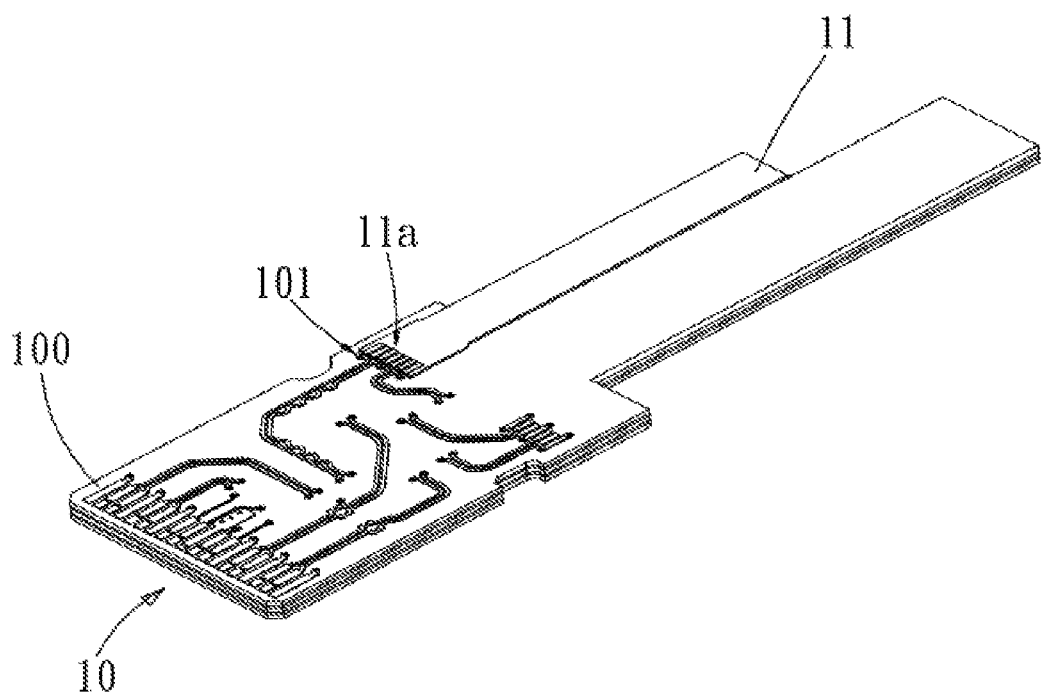
FIG. 2 is a schematic diagram of the link loopback device of the first embodiment of the present disclosure.
Figure 3:
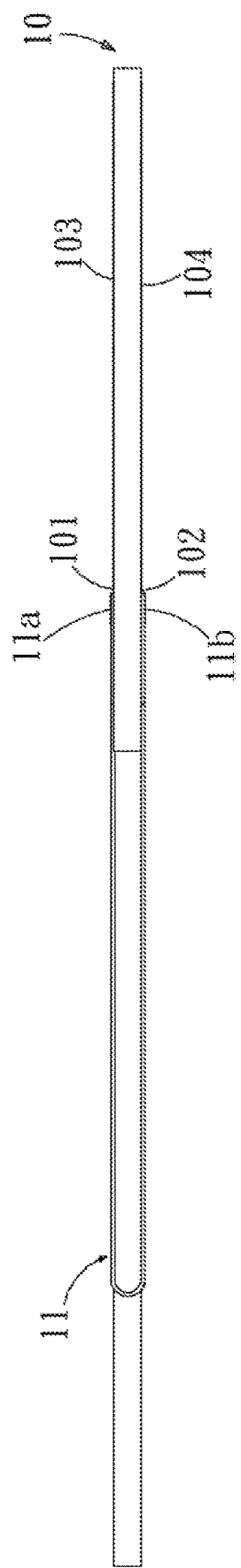
FIG. 3 is another schematic diagram of the link loopback device of the first embodiment of the present disclosure.

Refer to FIG. 1 to FIG. 3, which are perspective views and schematic diagrams of the link loopback device of the first embodiment of the present disclosure. As shown in the figures, the present embodiment provides a link loopback device 1 for testing the performance of switch and server of communication network devices. For example, it can be applied to interfaces such as SFP, QSFP, QSFP-DD, OSFP, CXP, CFP, etc. The link loopback device 1 of the present embodiment uses a flexible circuit board to perform attenuation simulation, so that the attenuation value of the signal starts from 0 dB to simulate a complete actual link, thereby to accurately determine the performance of the communication network device and also to avoid assembly and space problems caused by testing with DAC. The link loopback device 1 of the present embodiment comprises a substrate 10 and a flexible circuit board 11. The substrate 10 is provided with a signal transmission circuit (not shown), an interface connecting end 100, a transmitting end 101, and a receiving end 102, wherein the interface connecting end 100, the transmitting end 101 and the receiving end 102 are electrically connected by a signal transmission circuit. The flexible circuit board 11 has a first electrical connecting end 11a and a second electrical connecting end 11b, and the first electrical connecting end 11a and the second electrical connecting end 11b are connected by a signal transmission circuit. The first electrical connecting end 11a of the flexible circuit board 11 is electrically connected to the transmitting end 101 of the substrate 10, and the second electrical connecting end 11b of the flexible circuit board 11 is electrically connected to the receiving end 102 of the substrate 10, forming a high-speed link between the flexible circuit board 11 and the substrate 10. The substrate 10 described above can be a hard board relative to the flexible circuit board 11, such as a PCB board.

In practical, the substrate 10 possesses a first surface 103 and a second surface 104 opposite the first surface 103. In the present embodiment, the transmitting end 101 is disposed on the first surface 103, and the receiving end 102 is disposed on the second surface 104. The transmitting end 101 of the first surface 103 and the receiving end 102 of the second surface 104 are correspondingly disposed. The flexible circuit board 11 has a strip-shaped appearance, and the first electrical connecting end 11a and the second electrical connecting end 11b of the flexible circuit board 11 are located in the direction of the width of the flexible circuit board 11. The first electrical connecting end 11a of the flexible circuit board 11 is connected to the transmitting end 101, and the second electrical connecting end 11b of the flexible circuit board 11 is connected to the receiving end 102. Thus, one end of each flexible circuit board 11 is located on the first surface 103 of the substrate 10. By the bending of the flexible circuit board 11 relative to the substrate 10, the other end of each flexible circuit board 11 is located on the second surface 104 of the substrate 10.

When the interface connecting end 100 of the link loopback device 1 is connected to the interface of the communication network device, the host of the communication network device provides a high-speed signal to the link loopback device 1, and the high-speed signal is transmitted to the flexible circuit board 11 through the transmitting end 101 of the signal transmission circuit on the substrate 10. Then, the high-speed signal is transmitted from the first electrical connecting end 11a of the flexible circuit board 11 to the second electrical connecting end 11b of the flexible circuit board 11. When the high-speed signal passes through the flexible circuit board 11, the flexible circuit board 11 attenuates the high-speed signal, and the attenuation is determined according to the length of the flexible circuit board 11, that is, the length of the flexible circuit board 11 between the first electrical connecting end 11a of the flexible circuit board 11 and the second electrical connecting end 11b of the flexible circuit board 11. For example, the shorter the length of the flexible circuit board 11, the smaller the degree to which the flexible circuit board 11 attenuates the high-speed signal. The longer the length of the flexible circuit board 11, the greater the degree to which the flexible circuit board 11 attenuates the high-speed signal. After the high-speed signal is attenuated by the flexible circuit board 11, the attenuated high-speed signal is transmitted back to the host of the communication network device through the signal transmission circuit of the substrate 10 and determines the performance of the communication network device based on the high-speed signal transmitted back.

The link loopback device 1 of the present embodiment replaces components for attenuating high-speed signals by a flexible circuit board 11. The attenuation of the high-speed signal is adjusted by adjusting the length of the flexible circuit board 11 to adapt to the test requirements of various communication network devices. Meanwhile, the flexible circuit board 11 only occupies a small area of the substrate 10, so that the volume of the entire link loopback device 1 is reduced.

The signal transmission circuit on the substrate 10 further comprises a microcontroller and other components (such as indicator lights) to implement the automatic loopback protocol communication between the link loopback device 1 of the present disclosure and the communication network device. The signal transmission circuit on the substrate 10 of the present embodiment has the same function as the circuit on the circuit board of the link loopback device of the prior art, and the signal transmission circuit on the substrate 10 will not be described here. The interlace connecting end 100, the transmitting end 101, the receiving end 102, the first electrical connecting end 11a and the second electrical connecting end 11b comprises a plurality of terminal groups, respectively. The link loopback device 1 of the present embodiment further comprises a housing 12 for accommodating the substrate 10 and the flexible circuit board 11 with an opening 121 at one end thereof. The interface connecting end 100 of the substrate 10 is located in the opening 121 to connect with the interface of the communication network device.

Figure 4:
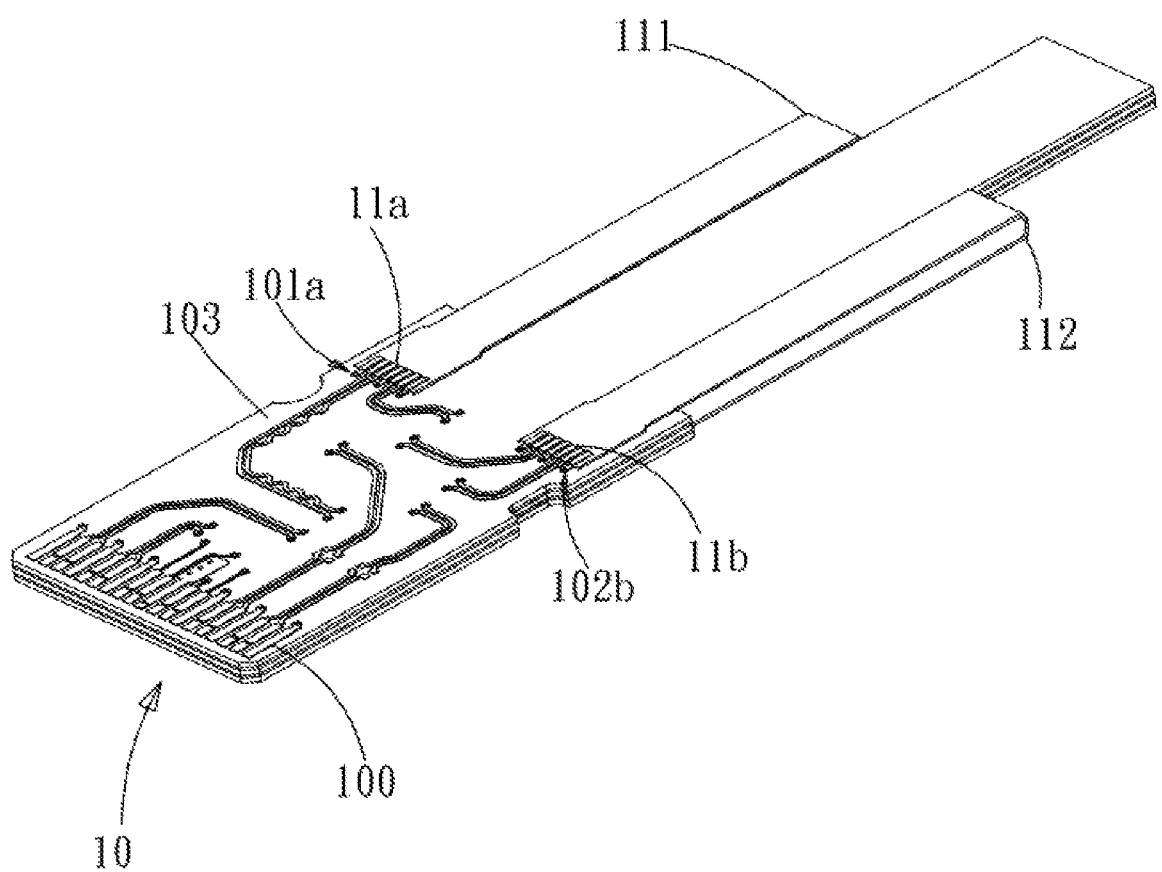
FIG. 4 is a schematic diagram of the link loopback device of the second embodiment of the present disclosure.
Figure 5:
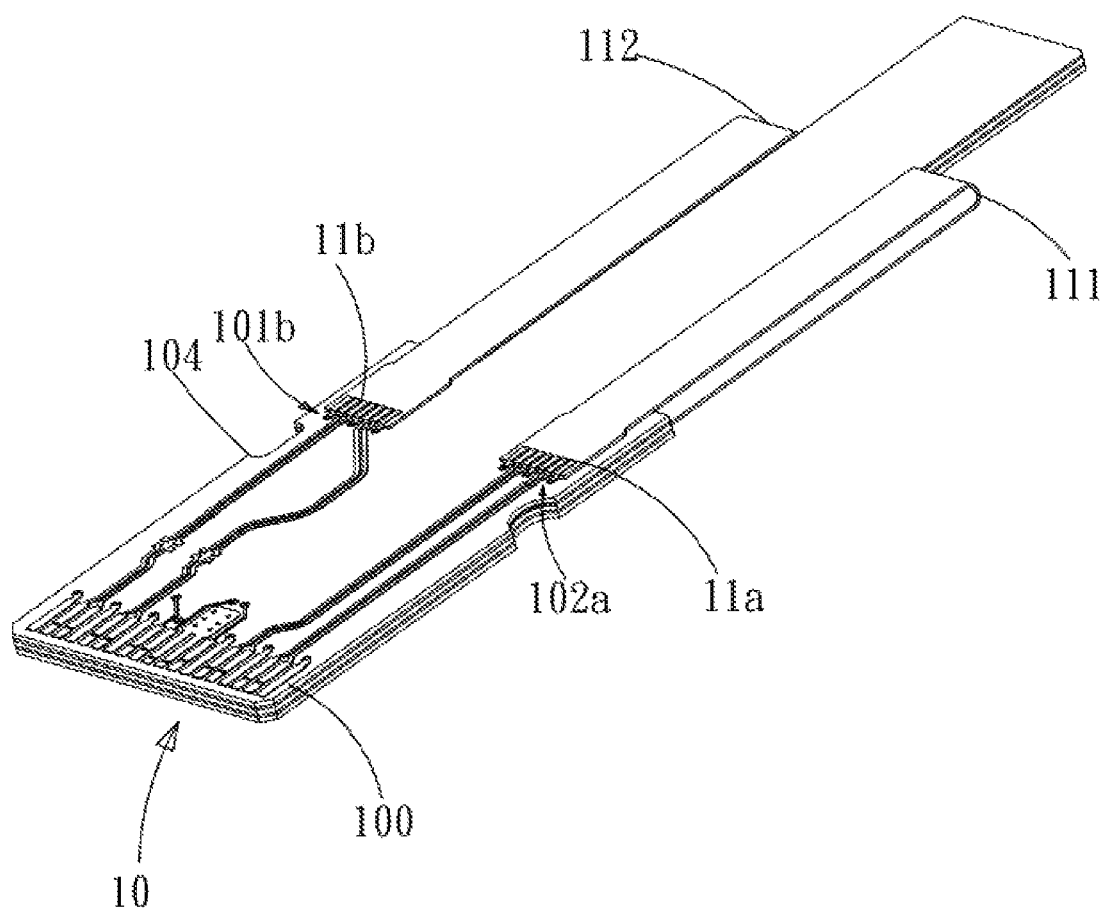
FIG. 5 is another schematic diagram of the link loopback device of the second embodiment of the present disclosure.

FIG. 4 and FIG. 5 are schematic diagrams of the link loopback device of the second embodiment of the present disclosure. As shown in the figures, the link loopback device of the present embodiment is different from that of the first embodiment in that the number of flexible circuit boards of the link loopback device of the present embodiment is two.

The two will be referred to as the first flexible circuit board 111 and the second flexible circuit board 112 in below. The first surface 103 of the substrate 10 of the present embodiment comprises a first transmitting end 101a and a second receiving end 102b. The second surface 104 comprises a second transmitting end 101b and a first receiving end 102a. The first transmitting end 101a of the first surface 103 is disposed corresponding to the first receiving end 102a of the second surface 104, and the second receiving end 102b of the first surface 103 is disposed corresponding to the second transmitting end 101b of the second surface 104. The first electrical connecting end 11a of the first flexible circuit board 111 is electrically connected to the first transmitting end 101a, and the second electrical connecting end 11b of the first flexible circuit board 111 is electrically connected to the first receiving end 102a. The first electrical connecting end 11a of the second flexible circuit board 112 is electrically connected to the second transmitting end 101b, and the second electrical connecting end 11b of the second flexible circuit board 112 is electrically connected to the second receiving end 102b. The first transmitting end 101a and the second receiving end 102b of the first surface 103 of the substrate 10 are arranged in a row along the width direction of the substrate 10 and the second transmitting end 101b and the first receiving end 102a of the second surface 104 of the substrate 10 are arranged in a row along the width direction of the substrate 10. Therefore, the first flexible circuit board 111 and the second flexible circuit board 112 are arranged side by side along the width direction of the substrate 10.

The link loopback device of the present embodiment comprises a first link and a second link, wherein the first link is formed between the first flexible circuit board 111 and the substrate 10, and the second link is formed between the second flexible circuit board 112 and the substrate 10. The two links can be used for the test of the link loopback on the same high-speed signal, or the two links can be used for the test of the link loopback on different high-speed signals.

In the first case, when the first link and the second link perform link loopback test on the same high-speed signal, the length of the first flexible circuit board 111 of the first link and the length of the second flexible circuit board 112 of the second link are the same. That is, the first flexible circuit board 111 and the second flexible circuit board 112 have the same attenuation of the high-speed signal. Only one of the two links needs to be selected for testing during the test.

In the second case, when the first link performs link loopback test on the first high-speed signal and the second link performs link loopback test on the second high-speed signal, the length of the first flexible circuit board 111 of the first link is determined according to the attenuation of the first high-speed signal and the length of the second flexible circuit board 112 of the second link is determined according to the attenuation of the second high-speed signal. The length of the first flexible circuit board 111 in the first link and the length of the second flexible circuit board 112 in the second link are the same. That is, the first high-speed signal is attenuated to the same extent as the second high-speed signal. This embodiment is only an example of the present disclosure. The link loopback device of the present disclosure can also comprise multiple links, wherein each link comprises a flexible circuit board and each flexible board attenuates the high speed-signals transmitted in the link. In this way, the link loopback device of the present embodiment can meet the test requirements of various communication network devices, and it is not necessary to change to another link loopback device when testing different communication network devices.

Figure 6:
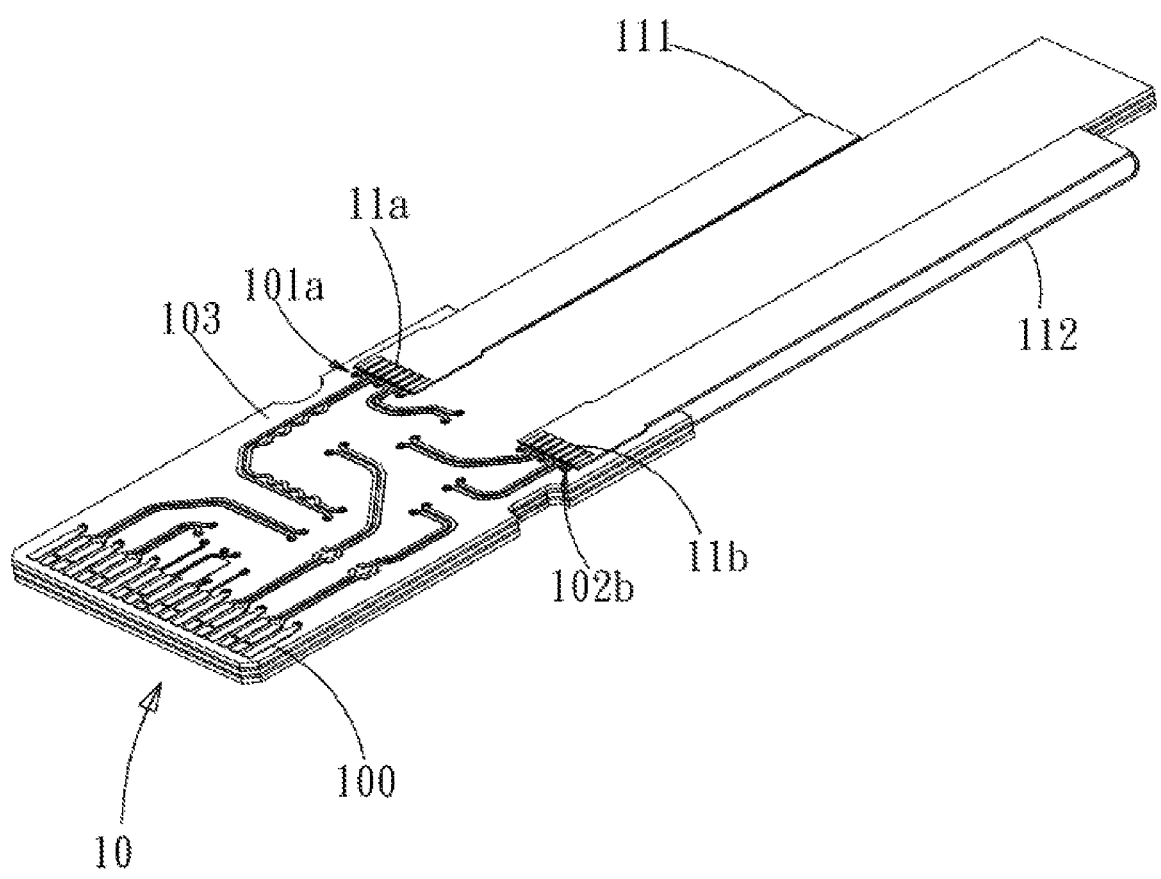
FIG. 6 is a schematic diagram of the link loopback device of the third embodiment of the present disclosure.

FIG. 6 is a schematic diagram of the link loopback device of the third embodiment of the present disclosure. As shown in the figure, the link loopback device of the present embodiment is different from that of the second embodiment in that the length of the first flexible circuit board 111 of the present embodiment and the length of the second flexible circuit board 112 are not the same. That is, the degree to which the first flexible circuit board 111 attenuates the high-speed signal and the degree to which the second flexible circuit board 112 attenuates the high-speed signal are not the same.

When the first link and the second link perform link loopback test on the same high-speed signal, the link back loop test can be performed by the first link or the second link according to the attenuation of the high-speed signal during the test. When the first link performs link loopback test on the first high-speed signal and the second link performs link loopback test on the second high speed signal, the length of the first flexible circuit board 111 is determined according to the attenuation of the first high-speed signal and the length of the second flexible circuit board 112 is determined according to the attenuation of the second high-speed signal.

Figure 7:
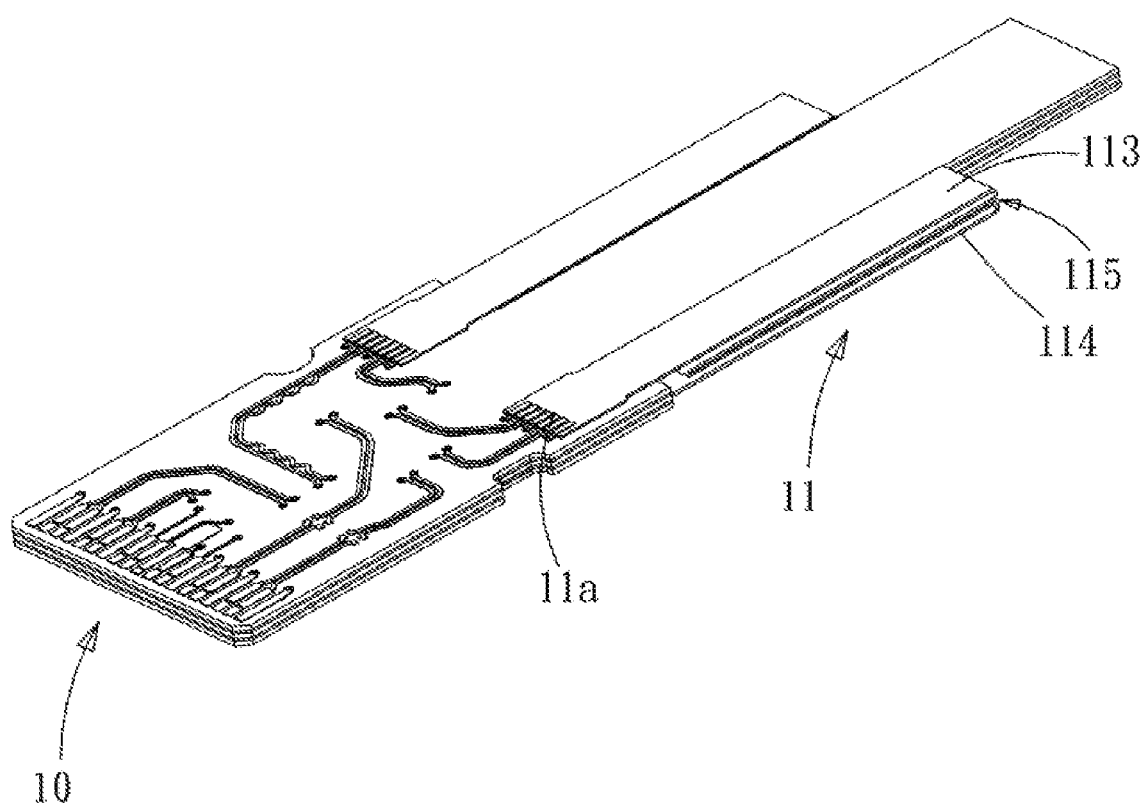
FIG. 7 is a schematic diagram of the link loopback device of the fourth embodiment of the present disclosure.
Figure 8:
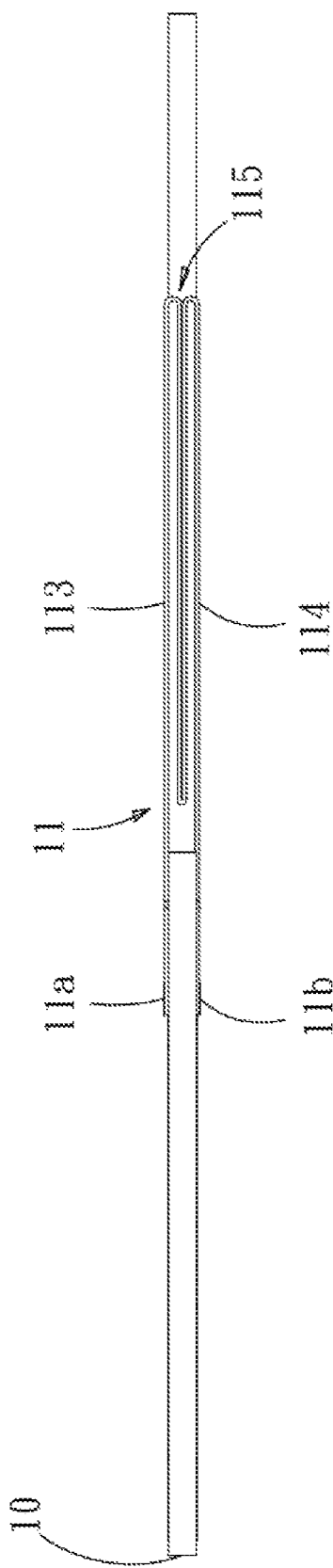
FIG. 8 is another schematic diagram of the link loopback device of the fourth embodiment of the present disclosure.

FIG. 7 and FIG. 8 are schematic diagrams of the link loopback device of the fourth embodiment of the present disclosure. As shown in the figures, the link loopback device of the present embodiment is different from that of the third embodiment in that the length of the second flexible circuit board is longer than that of the first flexible circuit board of the third embodiment. In the present embodiment, the flexible circuit board 11 with excessive length is bent to reduce the length of the flexible circuit board 11 protruding from the substrate 10. That is, when the length of the flexible circuit board 11 is too long, the flexible circuit board 11 between the first electrical connecting end 11a and the second electrical connecting end 11b can be bent. Therefore, the flexible circuit board 11 of the present embodiment comprises a first connecting end part 113, a second connecting end part 114 and a folding part 115 connected between the first connecting end part 113 and the second connecting end part 114. The first electrical connecting end 11a is located at one end of the first connecting end part 113 away from the folding part 115, and the second electrical connecting end 11b is located at one end of the second connecting end part 114 away from the folding part 115. The folding part 115 is formed by folding the flexible circuit board 11 into at least one layer, so that the folding part 115 is accommodated in between the first connecting end part 113 and the second connecting end part 114 without increasing the volume of the link loopback device.

Figure 9:
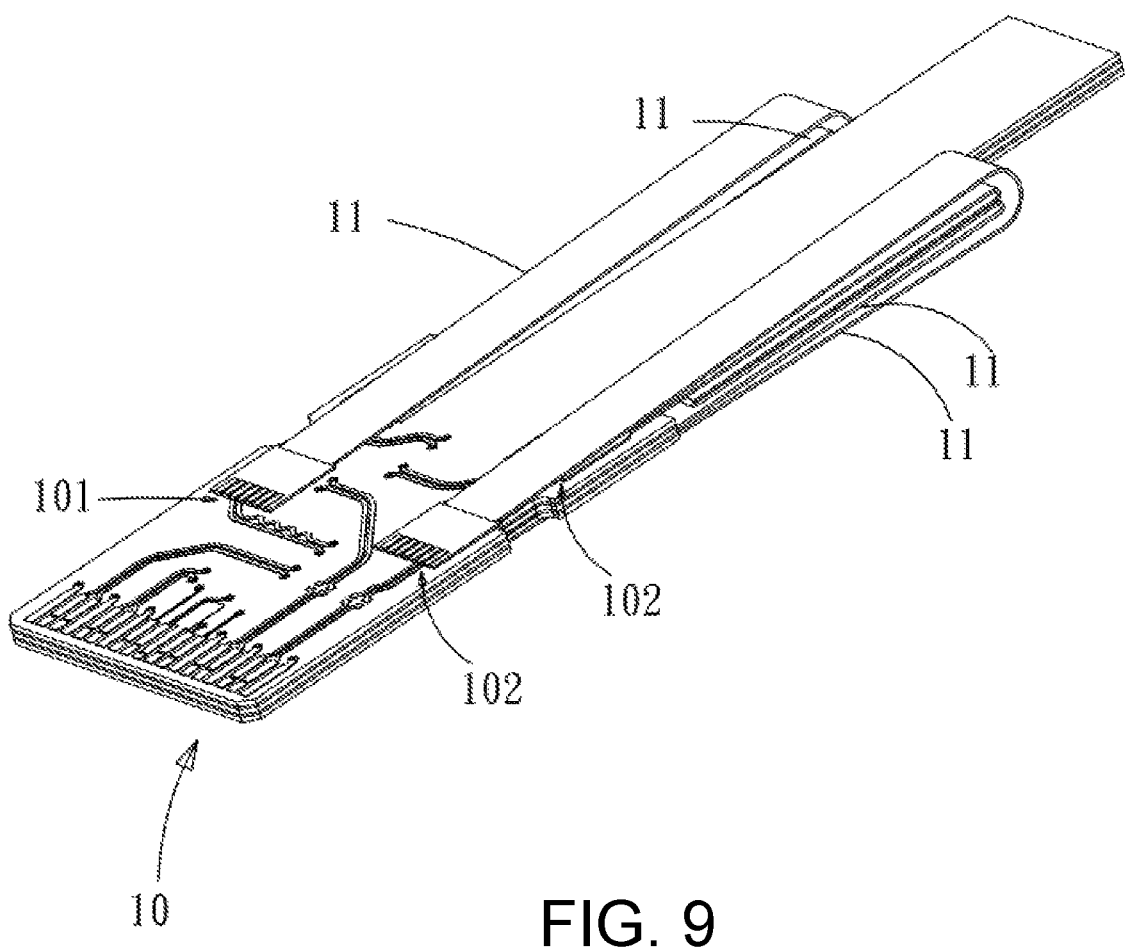
FIG. 9 is a schematic diagram of the link loopback device of the fifth embodiment of the present disclosure.

FIG. 9 is a schematic diagram of the link loopback device of the fifth embodiment of the present disclosure. As shown in the figure, the link loopback device of the present embodiment is different from that of the foregoing embodiments in that the link loopback device of the present embodiment comprises a plurality of links, and each link is provided with a flexible circuit board 11. That is, a link is formed between each flexible circuit hoard 11 and the substrate 10. In the present embodiment, there are four flexible circuit boards 11 forming four links with the substrate 10, respectively. The four flexible circuit boards 11 are divided into two groups, and the two flexible circuit boards 11 of each group are arranged side by side along the height direction of the substrate 10. One of the flexible circuit boards 11 covers the outside of the other flexible circuit board 11, and the flexible circuit board 11 located on the inner side is just the same as that of the fourth embodiment. The two groups are arranged side by side along the width direction of the substrate 10.

In practical, the flexible circuit board 11 of each link is electrically connected to the corresponding transmitting end 101 and the receiving end 102 of the substrate 10 respectively, which also means that the substrate 10 comprises a plurality of transmitting ends 101 and a plurality of receiving ends 102. In the present embodiment, two of the four links are the same link. That is, they perform attenuation simulation to the same high-speed signal. The remaining two links are therefore to be another link. That is, the remaining two links perform attenuation simulation to another high-speed signal. Furthermore, the two links formed between the two flexible circuit boards 11 and the substrate 10 in each group belong to the same link. The length of the two flexible circuit boards 11 is different, which means the two flexible circuit boards 11 respectively attenuate the high-speed signals transmitted in the link differently. Thus, the user can perform test to one of the two flexible circuit boards 11 according to the attenuation of the high-speed signal.

In addition to the above embodiments, another embodiment simulates attenuation to the same high-speed signal by three links formed between three flexible circuit boards 11 and the substrate 10 of the four flexible circuit boards 11. A link formed between the remaining flexible circuit board 11 and the substrate 10 simulates attenuation to another high-speed signal. Or, four links simulate attenuation to different high-speed signals.

The flexible circuit boards 11 of the above embodiments are connected to the outside of the substrate 10. Therefore, the flexible circuit board 11 is easy to be manufactured and replaced. It can be replaced with a flexible circuit board 11 with appropriate length according to the test requirements, and then the attenuation can be adjusted according to the test requirements.

Figure 10:
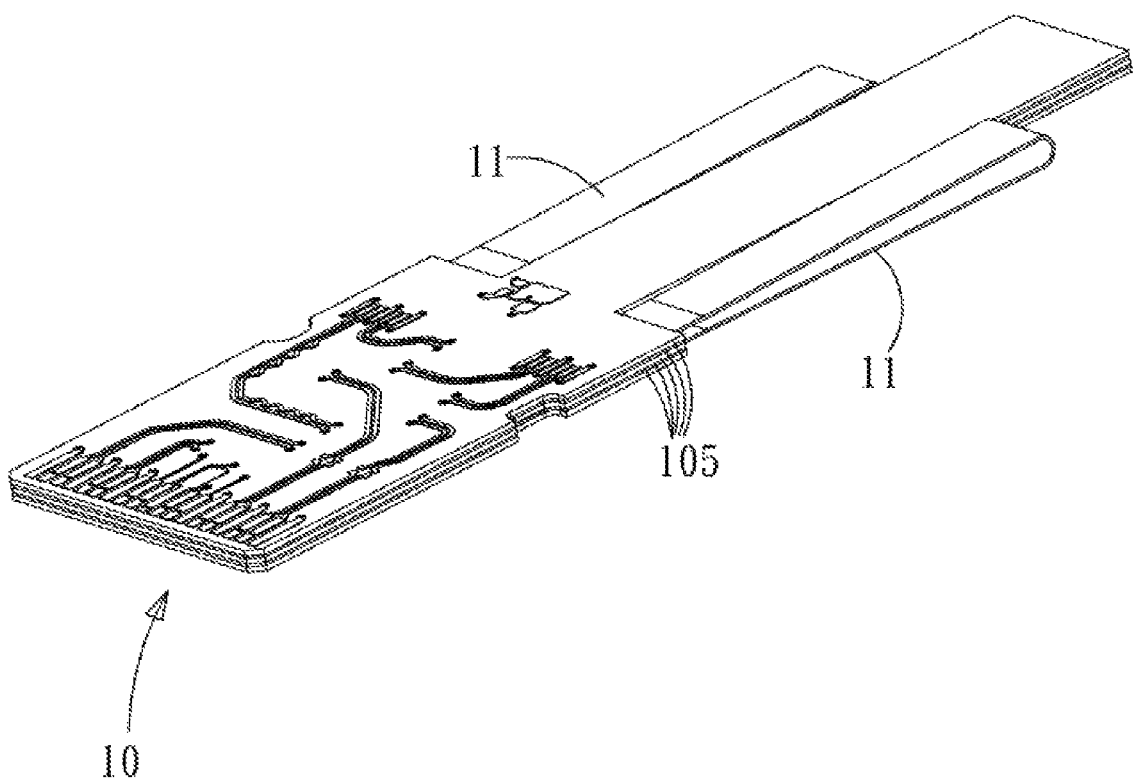
FIG. 10 is a schematic diagram of the link loopback device of the sixth embodiment of the present disclosure.
Figure 11:
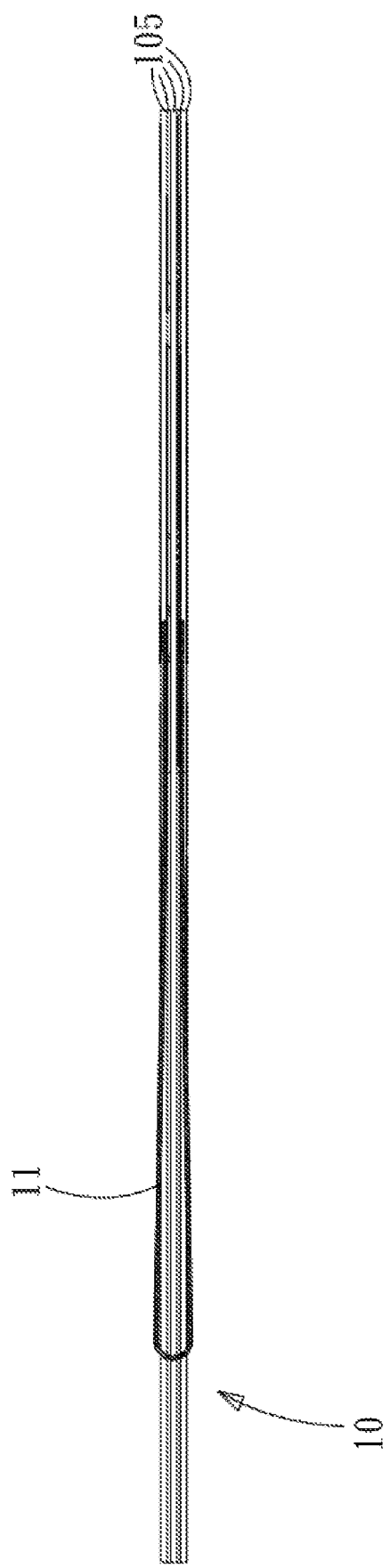
FIG. 11 is a cross-sectional of the link loopback device of the sixth embodiment of the present disclosure.

FIG. 10 is a schematic diagram of the link loopback device of the sixth embodiment of the present disclosure; FIG. 11 is a cross-sectional of the link loopback device of the sixth embodiment of the present disclosure. As shown in the figures, the link loopback device of the present embodiment is different from that of the foregoing embodiments in that the flexible circuit board 11 of the above embodiments are connected to the outside of the substrate 10, but the flexible circuit board 11 of the present embodiment is connected to the inside of the substrate 10. In general, the substrate 10 is formed by firstly stacking a plurality of plastic plates 105 followed by inserting the flexible circuit board 11 of the present embodiment in the process of stacking of the plastic plates 105. For example, the substrate 10 of the present embodiment is formed by stacking five layers of plastic plates 105. One end of the flexible circuit board 11 is formed together with the first plastic plate 105, and the other end of the flexible circuit board 11 is formed together with the fifth plastic plate 105. That is, one end of the flexible circuit board 11 is located between the first plastic plate 105 and the second plastic plate 105, and the other end of the flexible circuit board 11 is located between the fourth plastic plate 105 and the fifth plastic plate 105. The combination of the substrate 10 and the flexible circuit board 11 of the present embodiment can be called a rigid-flex board.

The manner of combination of the flexible circuit board 11 and the substrate 10 of the present embodiment can be applied to the combination of the flexible circuit board and the substrate of the above embodiments, so it will not be further described. The substrate of the above embodiment is provided with a circuit of a signal transmission circuit, and the signal transmission circuit is exactly the same as the circuit of the existing link loopback device. Therefore, the signal transmission circuit is not particularly described nor drawn in the figures.

In summary the present disclosure proposed a link loopback device for attenuating high-speed signals by a flexible circuit board therein. The flexible circuit board allows high-speed signal attenuation values to start at 0 dB to simulate a complete real link. By this, it can accurately determine the performance of communication network equipment. In addition, the flexible circuit board occupies only a small area of the substrate and can be bent for storage, so it can effectively reduce the volume of the link loopback device. In addition, the link loopback device of the present disclosure can use flexible circuit boards with different length to allow the user to select a flexible circuit board with an appropriate length according to an attenuation of the high-speed signal. That is, to select according to the communication network equipment. A plurality of flexible circuit boards can be simultaneously disposed onto the link loopback device of the present disclosure, and each flexible circuit board can simulate the attenuation to high-speed signals transmitted by different communication network devices. In other words, the link loopback device of the present disclosure can perform tests on different communication network devices and can set a flexible circuit board with the corresponding length according to the signal attenuation requirement of each communication network device.

It is to be understood that the term "comprises", "comprising", or any other variants thereof, is intended to encompass anon-exclusive inclusion, such that a process, method, article, or device of a series of elements not only include those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A link loopback device, comprising:
   a substrate having an interface connecting end, a transmitting end, and a receiving end, wherein the interface connecting end is electrically connected to the transmitting end and the receiving end; and
   a flexible circuit board having a first electrical connecting end and a second electrical connecting end; the first electrical connecting end of the flexible circuit board being electrically connected to the transmitting end of the substrate; the second electrical connecting end of the flexible circuit board being electrically connected to the receiving end of the substrate; a link being formed between the flexible circuit board and the substrate, and being an electrical loop to perform link loopback test on a signal.

2. The link loopback device according to claim 1, wherein the substrate comprises a first surface and a second surface opposite to the first surface; the transmitting end is located on the first surface; the receiving end is located on the second surface; the first electrical connecting end connected to the transmitting end on the flexible circuit board is located on the first surface; the second electrical connecting end connected to the receiving end on the flexible circuit board is located on the second surface; the flexible circuit board is bent relative to the substrate.

3. The link loopback device according to claim 1, wherein the first electrical connecting end and the second electrical connecting end of the flexible circuit board are embedded in the substrate; the flexible circuit board is bent relative to the substrate.

4. The link loopback device according to claim 1, further comprising a housing accommodating the substrate and the flexible circuit board; the housing has an opening; the interface connecting end is located in the opening.

* * * * *